US012110591B2

(12) United States Patent
Ruda Y Witt et al.

(10) Patent No.: US 12,110,591 B2
(45) Date of Patent: Oct. 8, 2024

(54) SUSCEPTOR ARRANGEMENT OF A CVD REACTOR (71) Applicant: AIXTRON SE, Herzogenrath (DE)

(72) Inventors: Francisco Ruda Y Witt, Eschweiler (DE); Marcel Kollberg, Würselen (DE); Hendrik Rauf, Aachen (DE)

(73) Assignee: AIXTRON SE, Herzogenrath (DE)

( * ) Notice: Subject to any disclaimer, the term of this patent is extended or adjusted under 35 U.S.C. 154(b) by 340 days.

(21) Appl. No.: 17/593,081

(22) PCT Filed: Feb. 28, 2020

(86) PCT No.: PCT/EP2020/055308
§ 371 (c)(1),
(2) Date: Sep. 8, 2021

(87) PCT Pub. No.: WO2020/182495
PCT Pub. Date: Sep. 17, 2020

(65) Prior Publication Data
US 2022/0186374 A1 Jun. 16, 2022

(30) Foreign Application Priority Data
Mar. 8, 2019 (DE) ............ 10 2019 105 913.5

(51) Int. Cl.
C23C 16/458 (2006.01)
C23C 16/46 (2006.01)
H01L 21/687 (2006.01)

(52) U.S. Cl.
CPC .......... C23C 16/46 (2013.01); C23C 16/4584 (2013.01); C23C 16/4585 (2013.01);
(Continued)

(58) Field of Classification Search
CPC . C23C 16/46; C23C 16/4584; C23C 16/4585; H01L 21/68735; H01L 21/68757; H01L 21/68771; H01L 21/68785
(Continued)

(56) References Cited

U.S. PATENT DOCUMENTS

2006/0102081 A1    5/2006   Ueno et al.
2006/0112881 A1*  6/2006   Kaeppeler ........... C23C 16/4586
                                                                  118/725
(Continued)

FOREIGN PATENT DOCUMENTS

DE        103 23 085 A1    12/2004
DE   10 2014 104 218 A1    10/2015
(Continued)

OTHER PUBLICATIONS

International Search Report mailed Aug. 20, 2020, from the ISA/EP, for International Patent Application No. PCT/EP2020/055308 (filed Feb. 28, 2020), 8 pgs.
(Continued)

Primary Examiner — Charlee J. C. Bennett
(74) Attorney, Agent, or Firm — Ascenda Law Group, PC (57) ABSTRACT A susceptor arrangement for use in a CVD reactor includes a circular or annular susceptor with a first susceptor broad side, on which a substrate holder and at least one covering element are arranged. At least one of the covering elements consists of multiple covering plates, in which a lowermost covering plate is adjacent to the first broad side face of the susceptor, and an uppermost covering plate covers the lowermost covering plate at least in certain regions and forms a free broad side face of the susceptor arrangement. The covering plates are preferably produced from silicon carbide, and are connected to one another by positioning elements.

10 Claims, 7 Drawing Sheets (52) U.S. Cl.
CPC .. *H01L 21/68735* (2013.01); *H01L 21/68757* (2013.01); *H01L 21/68771* (2013.01); *H01L 21/68785* (2013.01)

(58) Field of Classification Search
USPC ........................................................ 118/725
See application file for complete search history.

(56) References Cited

U.S. PATENT DOCUMENTS

| | | | |
|---|---|---|---|
| 2006/0201427 A1 | 9/2006 | Jurgensen et al. | |
| 2015/0345016 A1 | 12/2015 | Huang et al. | |
| 2017/0352575 A1* | 12/2017 | Gangakhedkar | ............................ H01L 21/67017 |
| 2021/0238740 A1* | 8/2021 | Wright | .................... C30B 25/12 |
| 2021/0262087 A1* | 8/2021 | Lauffer | ............... C23C 16/4586 |

FOREIGN PATENT DOCUMENTS

| | | |
|---|---|---|
| EP | 1657744 A2 | 5/2006 |
| JP | H05267277 A | 10/1993 |
| JP | 2005142529 A | 6/2005 |
| JP | 2012178488 A | 9/2012 |
| JP | 2013004593 A | 1/2013 |
| JP | 2016035080 A | 3/2016 |
| WO | 2018/138197 A1 | 8/2018 |

OTHER PUBLICATIONS

Written Opinion mailed Aug. 20, 2020, from the ISA/EP, for International Patent Application No. PCT/EP2020/055308 (filed Feb. 28, 2020), 24 pgs.

International Preliminary Report on Patentability issued Aug. 25, 2021, from The International Bureau of WIPO, for International Patent Application No. PCT/EP2020/055308 (filed Feb. 28, 2020), with English translation, 26 pgs.

* cited by examiner

SUSCEPTOR ARRANGEMENT OF A CVD REACTOR

RELATED APPLICATIONS

This application is a National Stage under 35 USC 371 of and claims priority to International Application No. PCT/EP2020/055308, filed 28 Feb. 2020, which claims the priority benefit of DE Application No. 10 2019 105 913.5, filed 8 Mar. 2019.

FIELD OF THE INVENTION

The invention relates to a susceptor arrangement for use in a CVD reactor comprising a circular or annular susceptor with a first susceptor broad side, on which a substrate holder and at least one covering element are arranged.

The invention further relates to a CVD reactor with such a susceptor arrangement.

BACKGROUND

CVD reactors are known from US 2006/0201427 A1, DE 103 23 085 A1, JP 2012-178488 A, JP 2016-035080 A, JP 2013-004593 A, US 2006/0201427 A, EP 1 657 744 A2, US 2015/0345016 A1 and DE 10 2014 104 218 A1. The covering elements described therein consist of several covering plates, regions of which overlap each other.

The CVD reactor according to the invention as basically previously known from prior art has a process chamber, into which a process gas is fed by means of a gas inlet organ. One or several substrates are located on a susceptor, which are coated via a pyrolytic separation of the process gas. In particular, the process gas is a metalloorganic compound of an element of the III-main group and a hydride of an element of the V-main group. The metalloorganic compounds and the hydrides are fed into the process chamber with a carrier gas, for example hydrogen, so that III-V-semiconductor layers can there be deposited onto substrates. Substrate holders are located on the first broad side surface of the susceptor facing toward the process chamber, which in particular are rotatably mounted on a gas cushion. Each substrate holder carries at least one of the substrates to be coated. The surface areas between the substrate holders are covered with covering elements, which are wearing parts and must be changed out from time to time. The covering plates are several millimeter thick graphite plates, which are coated with SiC. The covering plates are acted upon not only by the reactive gases used during layer deposition, but can also be acted upon by cleaning gases, in particular etching gases. This leads to an impairment of the quality of the surface coating of the covering elements. As a consequence, the covering elements are wearing parts. Substituting the graphite plates coated with SiC with solid SiC plates leads to a high material use of silicon carbide, which is high-priced in the purity required. Diminishing the material thickness of the covering elements comprised of plates leads to undesired temperature elevations on the surface of the covering elements.

SUMMARY OF THE INVENTION

The object of the invention is to indicate measures with which the operation of such a CVD reactor for producing coated semiconductors can be designed more economically.

The object is achieved by the invention indicated in the claims, wherein the subclaims describe not only advantageous further developments of the invention, but also stand-alone solutions of the object.

It is initially and essentially proposed for a susceptor arrangement or a CVD reactor of the kind characterized previously that the covering element be comprised of several plates stacked one on top of the other, wherein this plate stack has at least one lowermost covering plate and one uppermost covering plate. The stack of covering plates can consist of precisely two covering plates, specifically an uppermost and a lowermost covering plate. A further development of the invention provides that the covering plates consist of silicon carbide. However, they can also consist of graphite plates coated with silicon carbide. The used covering plates preferably have a material thickness of less than 2 mm. The material thickness measures about 1 mm. The covering plates can have sizes that differ from each other. In particular, it is provided that a lowermost covering plate has a larger surface extension than an uppermost covering plate carried by the former or arranged thereover. In particular, it is provided that the uppermost covering plate lie flat on the lowermost covering plate that carries it. The covering plates can at least partially comprise circular storage pockets for storing one respective substrate holder. For this purpose, they have a peripheral edge that runs along a circular arc line. In particular, it is provided that the lowermost covering plate partially comprise at least two storage pockets that are adjacent to each other. This lowermost covering plate preferably carries precisely one uppermost covering plate. Embodiments of the invention can further provide that a covering plate, in particular a lowermost covering plate, partially comprise at least one storage pocket or a substrate holder, or precisely one substrate holder. It can further be provided that a covering plate, in particular a lowermost covering plate, completely comprise a storage pocket or several storage pockets or substrate holders enclosed therein. It can further be provided that two covering plates, in particular lower covering plates, which each partially or completely comprise at least one storage pocket or substrate holders enclosed therein, have arranged between them an additional covering plate, which does not adjoin any storage pocket or any substrate holder. In particular, it is provided that the two covering plates form a plate stack, which is no thicker than 2 or 3 mm. It can further be provided that the covering plates be tied to the first broad side surface of the susceptor by means of positioning elements. The positioning elements can form pins, which at least regionally engage into openings of the first broad side surface of the susceptor. The covering plates have openings through which the pins can reach. In particular, it is provided that a lowermost covering plate has a passage opening through which a shaft of a positioning element reaches. The positioning element can reach through an annular spacer, which keeps the lowermost covering plate at a defined distance to the first broad side of the susceptor. Additional spacers can be provided to space the uppermost covering plate apart from the lowermost covering plate. This causes a spacing gap to form between two covering plates arranged one directly over the other. The spacing means can be spacing washers. However, they can (supplementarily) also be formed by sockets originating from the broad side of the susceptor. It can also be provided that the positioning element have a head with an expanded diameter. This head can rest upon the lowermost or uppermost covering plate. In particular, it is provided that the uppermost covering plate have a blind hole open toward the lowermost covering plate, into which an uppermost section of the positioning element engages. This imparts a closed, free surface to the uppermost covering plate that adjoins the process chamber. The positioning pin can be comprised of a cylindrical pin, whose lower section engages into an opening of the lowest covering plate in a form fitting manner. The lowermost covering plate can have two openings, which are radially arranged in particular in relation to an axis of the susceptor, into which a respective lower section of a positioning element is inserted. An upper section of one of the two positioning elements engages into an opening of the lower side of the uppermost covering plate that is form fitting in relation to the upper section. The upper section of the other positioning element engages into an opening of the uppermost covering plate designed as an oblong hole. An edge of the upper covering plate can run along a straight line. The downwardly facing end face of the positioning element can be supported on the first broad side of the susceptor. It need not engage into an opening of the susceptor arranged there if the lowermost covering plate is connected with the susceptor at other locations with other positioning elements. Two edges of a first covering plate that run at an angle relative to each other can intersect at a point. It is further provided that the edges of an uppermost covering plate flank straight running channels, into which forked fingers of a robot arm can engage so as to lift a substrate holder. The end of the robot arm can have a fork with two parallel fork arms. The height of a covering element designed in this way and comprised of at least two covering plates can measure less than 9 mm. The height can be less than the material thickness of a substrate holder, which is at least partially enveloped by a plate stack configured in this way, wherein the substrate holder is floatingly carried on a gas cushion by a purging gas flow comprising the gas cushion, which is fed by the susceptor against the underside of the substrate holder into the gas cushion arranged there. In one variant of the invention where the positioning elements engage into openings of the uppermost covering plate that are closed toward the process chamber side, the material thickness of the uppermost covering plate can be greater than the material thickness of the lower covering plate. It can be at least two or at least three times as large. As a consequence, it can be provided that the uppermost covering plate has a material thickness of 2 to 3 mm.

BRIEF DESCRIPTION OF THE DRAWINGS

The invention will be explained in more detail below based upon exemplary embodiments. Shown on.

DETAILED DESCRIPTION

Figure 1:
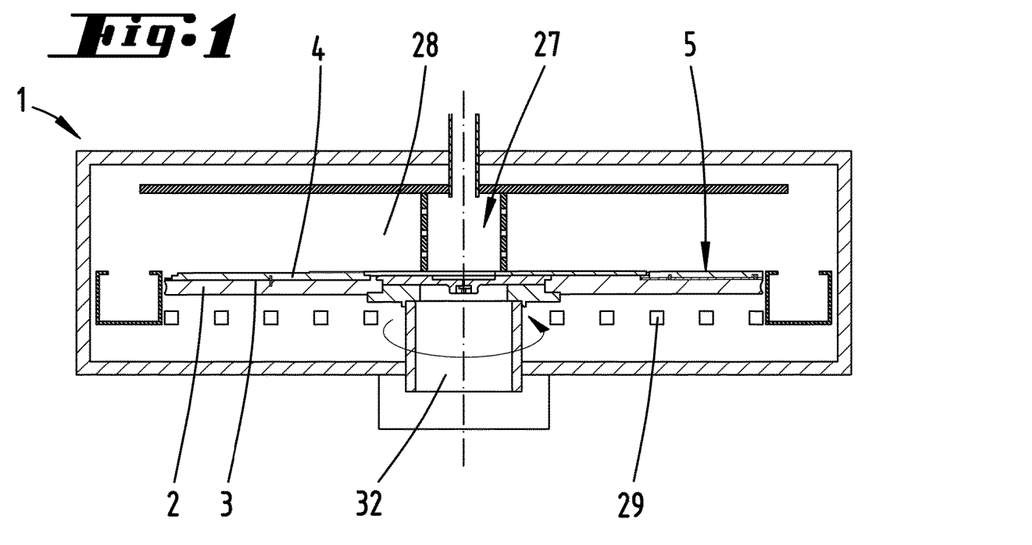
FIG. 1 is a schematic cross sectional view of a CVD reactor.

FIG. 1 schematically depicts a CVD reactor 1 according to the invention with a housing, in which are located a gas inlet organ 27 for letting in process gases, a susceptor 2 for supporting substrates to be coated, and a heating device 29 for heating the susceptor 2. The susceptor 2 rests on a carrier 32, with which the susceptor 2 can be rotary driven around an axis.

Covering elements 5, 15 are located on the susceptor 2. In the drawings, the susceptor arrangement has varyingly designed covering elements 5, 15 for illustrating different variants of the invention. In reality, a susceptor arrangement preferably has exclusively covering elements 5, 15 that are designed identically to each other.

Figures 5, 6:
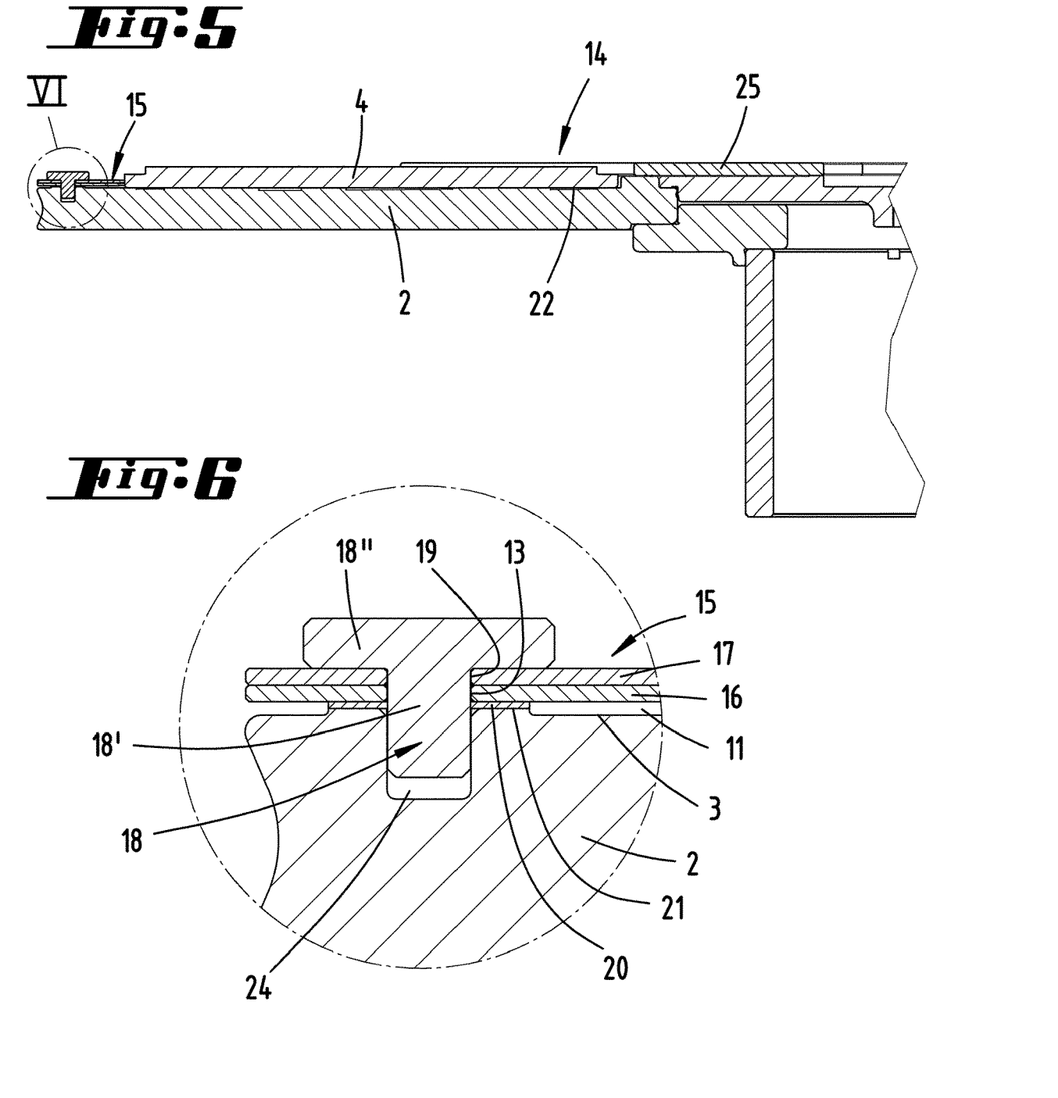
FIG. 5 is the section according to line V-V on FIG. 4 to illustrate a first exemplary embodiment.
FIG. 6 is a magnified view of the VI cutout on FIG. 5.
Figure 7:
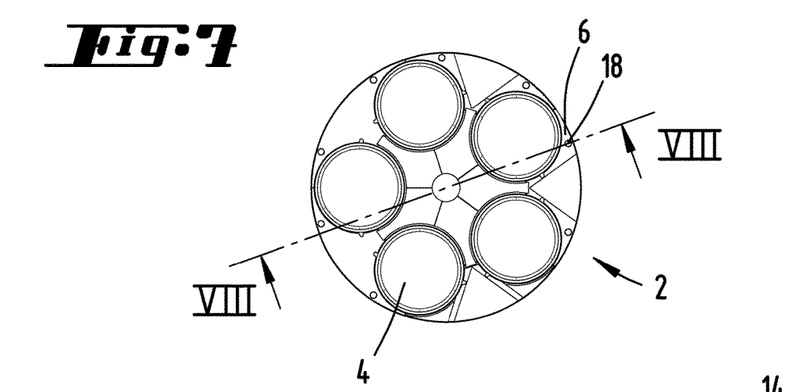
FIG. 7 is a view according to FIG. 4.

In the first exemplary embodiment shown on FIGS. 5 and 6, a covering element 5 consists of two flat bodies designed identically to each other, which consist of solid silicon carbide. The lowermost covering plate 16 has an underside that lies directly opposite a broad side 3 of the susceptor 2 consisting of graphite. A gap 11 is formed between the downwardly facing broad side surface of the lowermost covering plate 16 and the upwardly facing broad side 3 by a socket 21 or a spacer element 20.

The uppermost covering plate 17 is congruent to the lowermost covering plate 16. Both covering plates 16, 17 form peripheral edges that run on a circular arc line, which border a storage place of a substrate holder 4. As a result, the substrate holder 4 is inserted in a pocket 22 having a pocket floor into which undepicted gas lines empty, through which a purging gas can be fed, lifting the substrate holder 4 and rotationally driving it, suspended on a gas cushion. A centering pin can be inserted in the center of the floor of the pocket 22, which engages into a centering opening on the underside of the substrate holder 4, so as to in this way form a rotational axis around which the substrate holder 4 can rotate when the purging gas is fed into the gap between the floor of the pocket 22 and the underside of the substrate holder 4.

The two covering plates 16, 17 lying one over the other have openings 13, 19 that align with each other, which in turn align with insertion openings 24 in the broad side 3 of the susceptor 2. In the exemplary embodiment, a spacer element 20 lies between the lowermost covering plate 16 and broad side 3 or socket 21, and has an opening through which a shaft 18' of a positioning element 18 reaches. The shaft 18' of the positioning element 18 reaches through the two openings 13, 19 of the two covering plates 16, 17 lying one over the other. A head 18" having a larger diameter than the shaft 18' lies on the upwardly facing upper side of the uppermost covering plate 17. It forms a free surface that faces toward the process chamber 28. The positioning element 18 can be fabricated out of silicon carbide.

Figure 8:
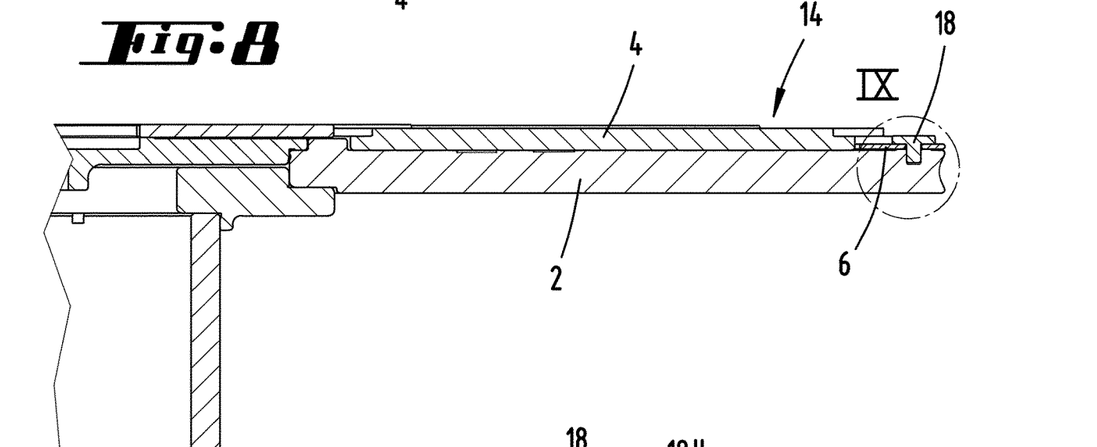
FIG. 8 is the section according to line VIII-VIII on FIG. 7 to illustrate a second exemplary embodiment.
Figure 9:
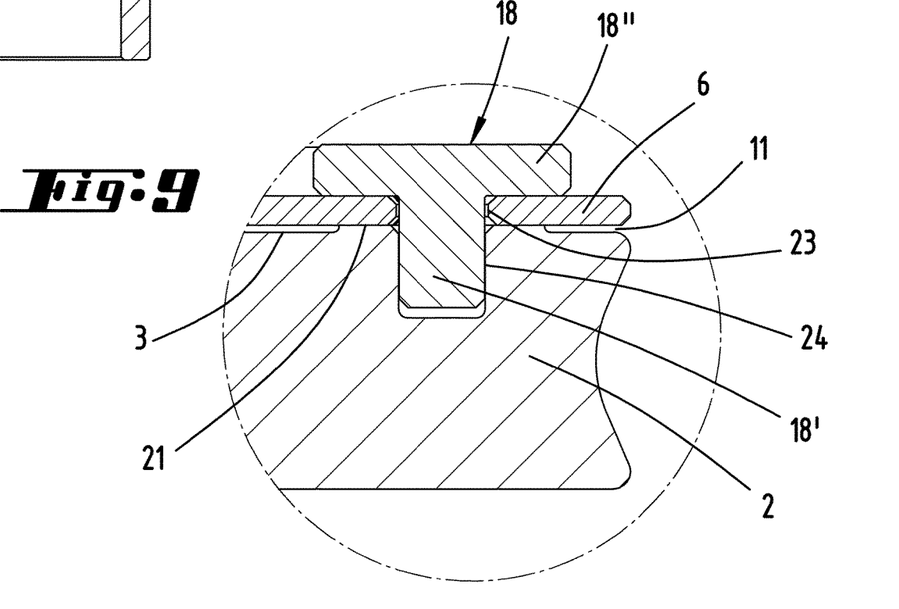
FIG. 9 is a magnified view of the IX cutout on FIG. 8.
Figure 10:
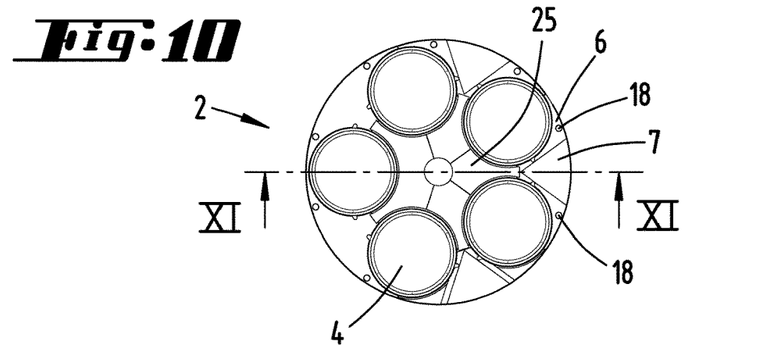
FIG. 10 is a view according to FIG. 4.

In the exemplary embodiment shown on FIGS. 8 and 9, a positioning element 18 with a shaft 18' and a head 18" only reaches through an opening 23 of a lowermost covering plate 6, so as to connect this lowermost covering plate 6 with the susceptor 2, while forming a gap 11 between the susceptor broad side 3 and the lowermost covering plate 6. For this purpose, the susceptor 2 has an insertion opening 24, into which the lower end of the shaft 18' is inserted.

Figures 11, 12, 13:
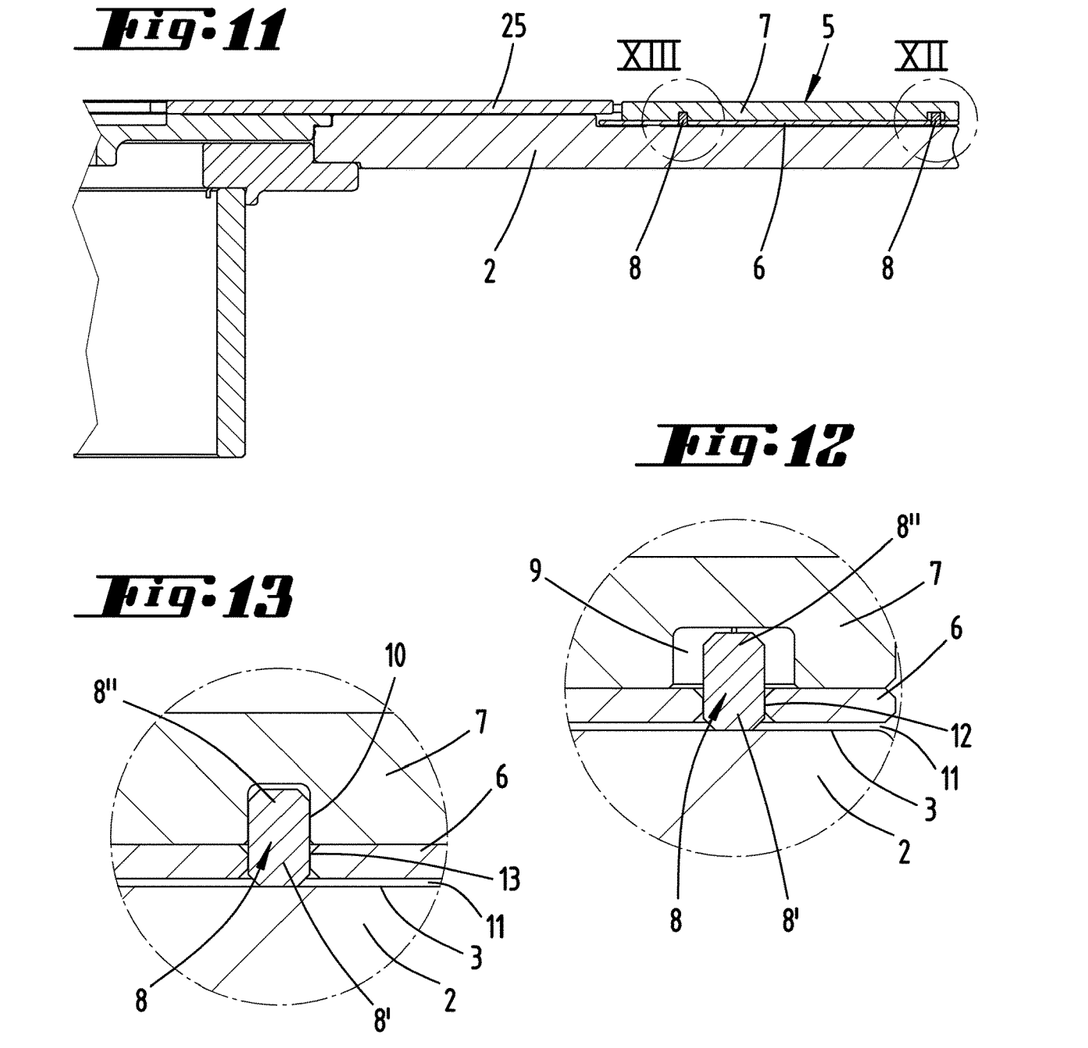
FIG. 11 is the section according to the XI-XI line on FIG. 10 to illustrate a second exemplary embodiment.
FIG. 12 is a magnified view of the XII cutout on FIG. 11.
FIG. 13 is a magnified view of the XIII cutout on FIG. 11.

FIGS. 11 to 13 along with FIGS. 8 to 9 show an exemplary embodiment in which the uppermost covering plate 7 has a smaller surface extension than the lowermost covering plate 6. Here as well, it is provided that the stack comprised of two covering plates 6, 7 be connected with the susceptor with only two positioning elements 8. The opening 23 through which the shaft 8' of the positioning element 8 reaches can have a somewhat larger diameter than the shaft 8' of the positioning element 8, so that the constituents of the susceptor arrangement can move in relation to each other while heating up the susceptor 2.

FIGS. 11 to 13 show the attachment of a roughly triangular uppermost covering plate 7 to a lowermost covering plate 6. The uppermost covering plate 7 lies flatly on the lowermost covering plate 6. The uppermost covering plate 7 has two blind holes 9, 10. These are located on the underside of the uppermost covering plate 7. A first blind hole 10 is form fitted to an upper section 8" of a positioning element 8 that has the shape of a cylinder pin, and whose lower section 8' is inserted into a form fitting opening 13 of the lowermost covering plate 6. The second blind hole 9 in the underside of the uppermost covering plate 7 is designed as an oblong hole, so that the two covering plates 6, 7 can move in relation to each other given a thermal expansion. The lowermost covering plate 6 and the uppermost covering plate 7 are connected with each other with precisely two positioning elements 8, wherein the positioning elements 8 are arranged one after the other in about a radial direction-relative to the center of rotation of the susceptor 2. However, it is also possible to arrange the positioning elements 8 one next to the other. For example, they can lie next to each other in an azimuthal direction.

One end face of the lower section 8' of the positioning element 8 can support itself on the broad side 3 of the susceptor 2. The uppermost covering plate 7 should not be supported on the end face of the upper section 8" of the positioning element 8, even if this might also be possible in variants that are not preferred. In this unpreferred variant, the respective floor of the second blind holes 9, 10 would support itself on this end face. This would not only make it possible to space the uppermost covering plate 7 apart from the lowermost covering plate 6 by means of a gap. The two pin-shaped positioning elements 8 could then also be completely covered by the uppermost covering plate 7. However, the uppermost covering plate 7 preferably lies on the lowermost covering plate 6. As a consequence, there is a distance between the end face of the upper section 8" and the floor of the blind hole 9, 10.

Here as well, it can be provided that the positioning element 8 consist of silicon carbide. However, the positioning element 8 preferably consists of sapphire, unless it is exposed to the process chamber.

The two positioning elements 8 with which the lowermost covering plate 6 is fastened to the susceptor 2 define a line, which runs through the two openings 23 of the lowermost covering plate 6. The two positioning elements 8 with which the uppermost covering plate 7 is fastened to the lowermost covering plate 6 likewise define a line. The two lines are perpendicular to each other.

The lowermost covering plate 6 can have an outline contour identical to the lowermost covering plate 16. The lowermost covering plate 6 has two sections, in which the peripheral edge runs on a circular arc line, so that the lowermost covering plate 6 partially envelops two pockets 22.

The uppermost covering plate 7 lying on the lowermost covering plate 6 has two edges 30 that meet at an acute angle, which run along a straight line. The edges 30 each flank channels 31, into which fork arms of a fork of a gripping arm can engage, with which a substrate holder 4 can be lifted out of the pocket 22 that stores it.

Figure 2:
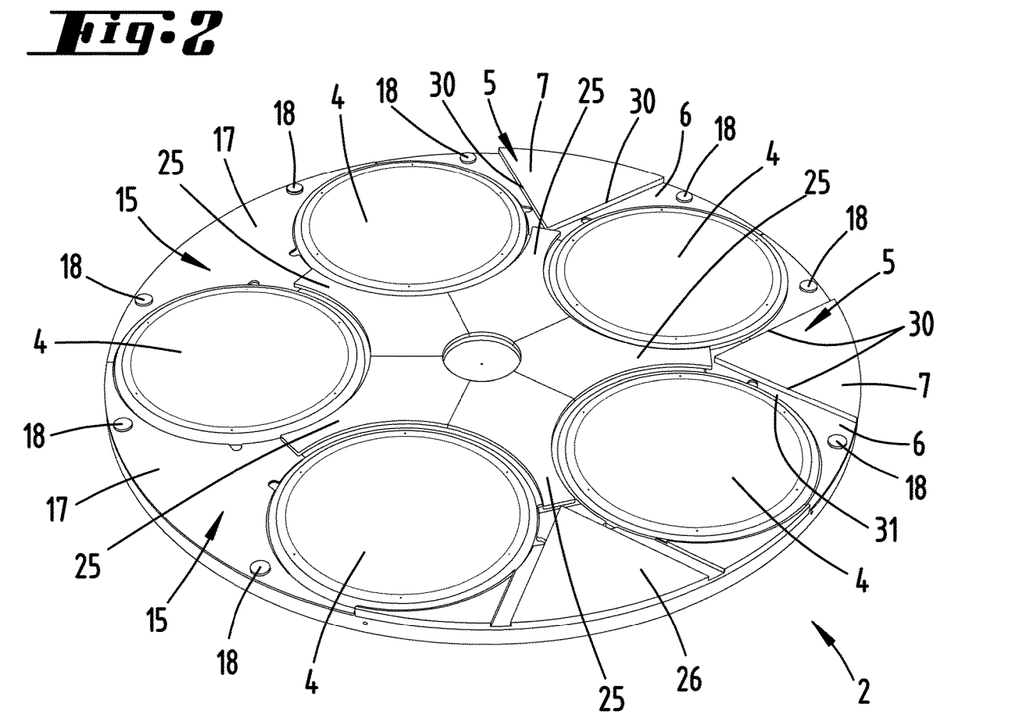
FIG. 2 is a perspective view of a susceptor arrangement, consisting of a susceptor 2 and several covering elements lying thereupon from various exemplary embodiments.
Figure 3:
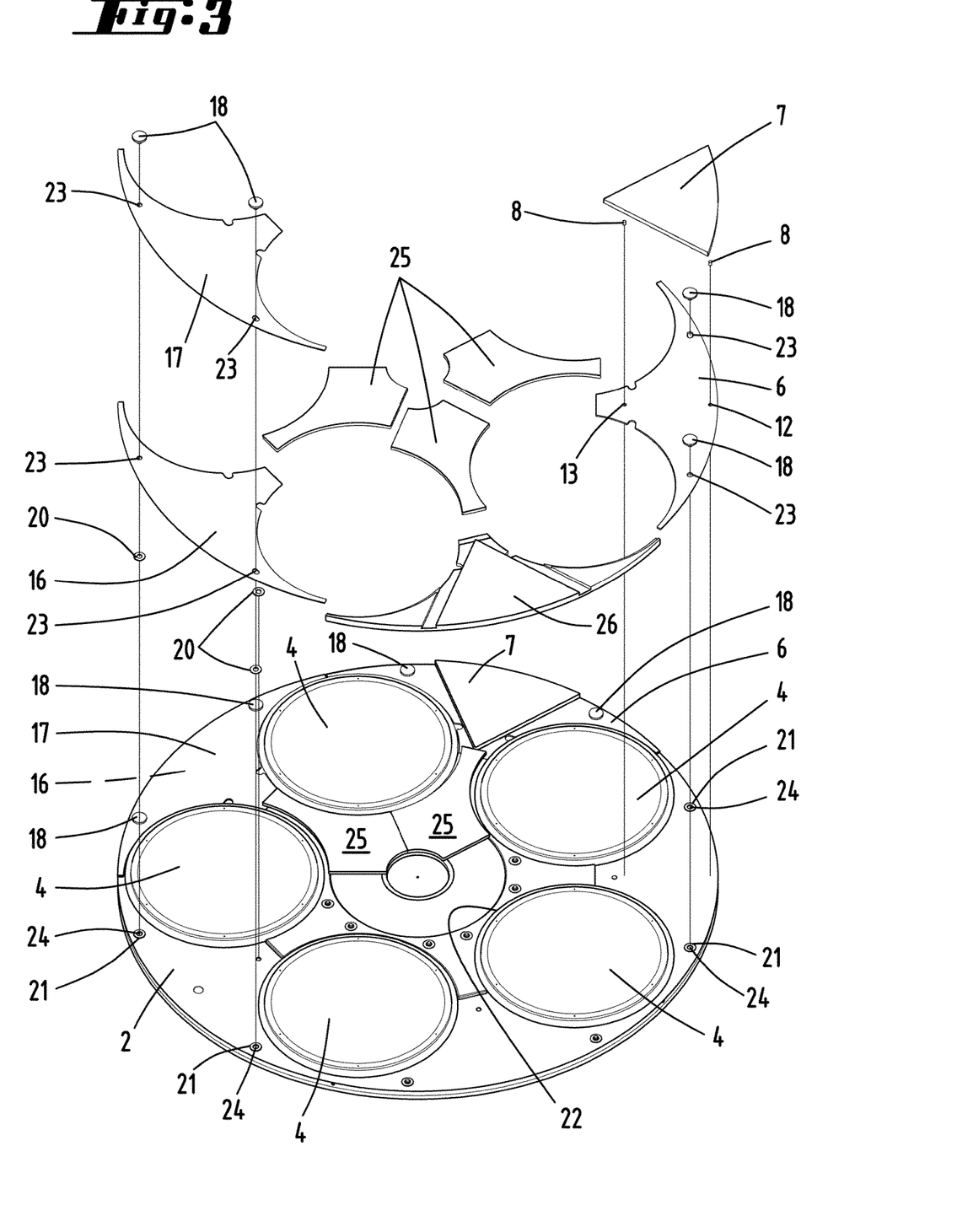
FIG. 3 is an exploded view of the susceptor arrangement shown on FIG. 2.
Figure 4:
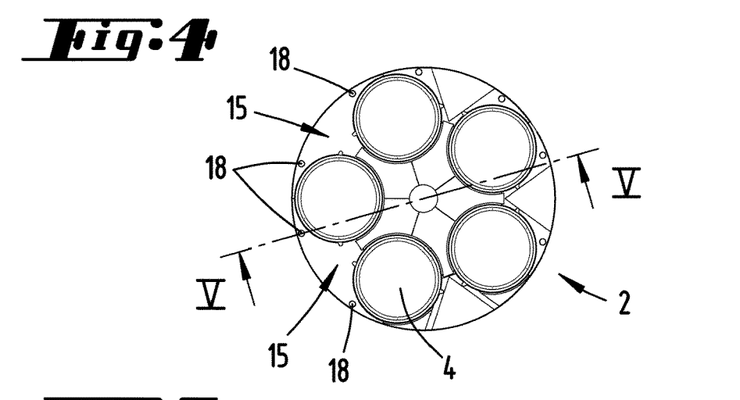
FIG. 4 is a top view of the susceptor arrangement.

FIGS. 2 and 3 further show additional covering plates 25, 26, which likewise have rounded edges that flank a pocket 22.

Figure 14:
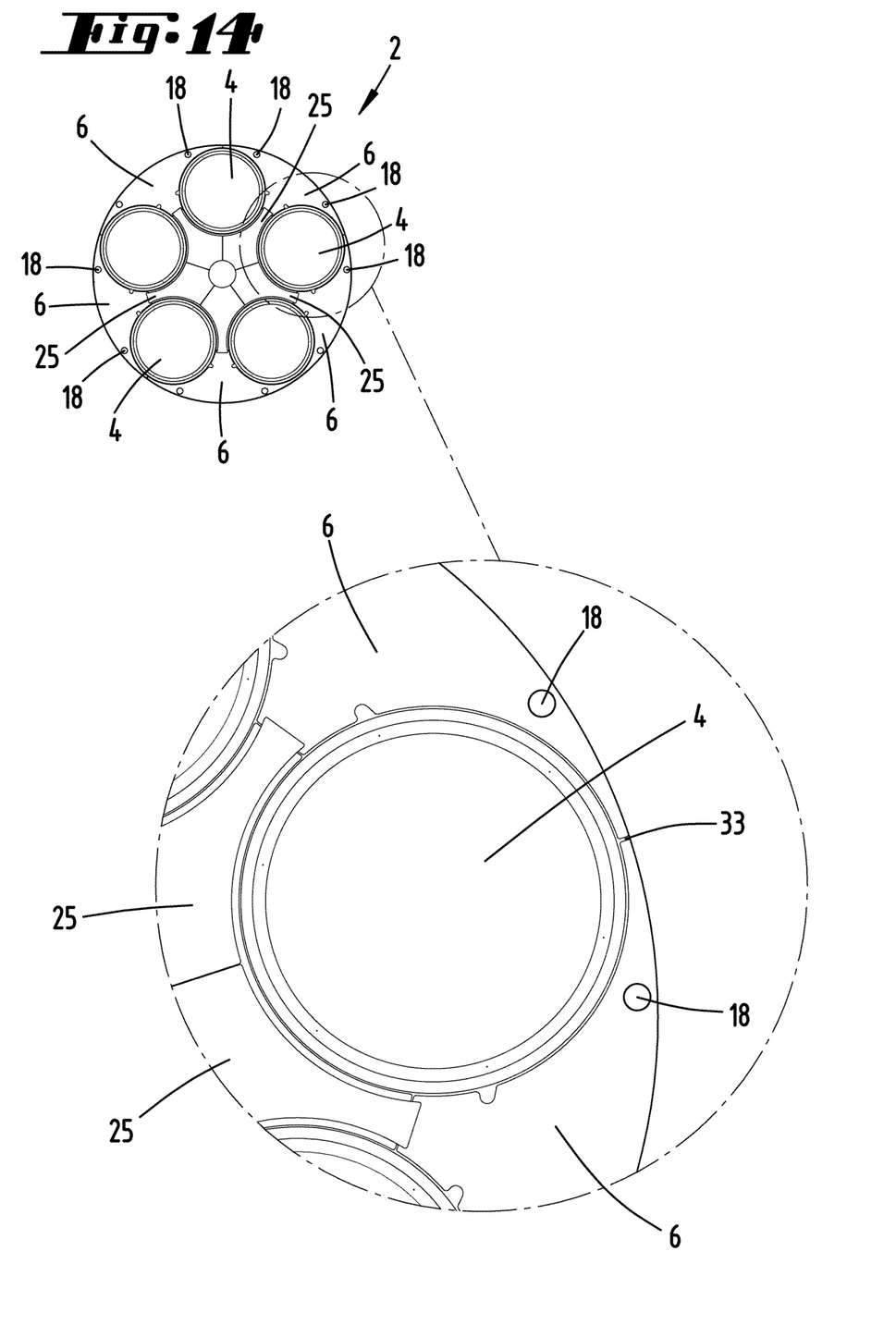
FIG. 14 is a view of an exemplary embodiment in which a lowermost covering plate 6 is adjacent to two substrate holders 4.

FIG. 14 shows a susceptor 2 with five substrate holders 4 arranged thereupon, which are each inserted into a storage pocket. The lowermost covering plate 6 is designed in such a way as to have two arced peripheral edges, with which two substrate holders 4 or storage pockets are partially enveloped. In this exemplary embodiment, a storage pocket or a substrate holder 4 arranged therein is partially enveloped by a total of four covering plates, specifically the two radially outer covering plates 6 and two radially inner covering plates 25. A gap forms 33, at which the two radially outer covering plates 6 adjoin each other.

Figure 15:
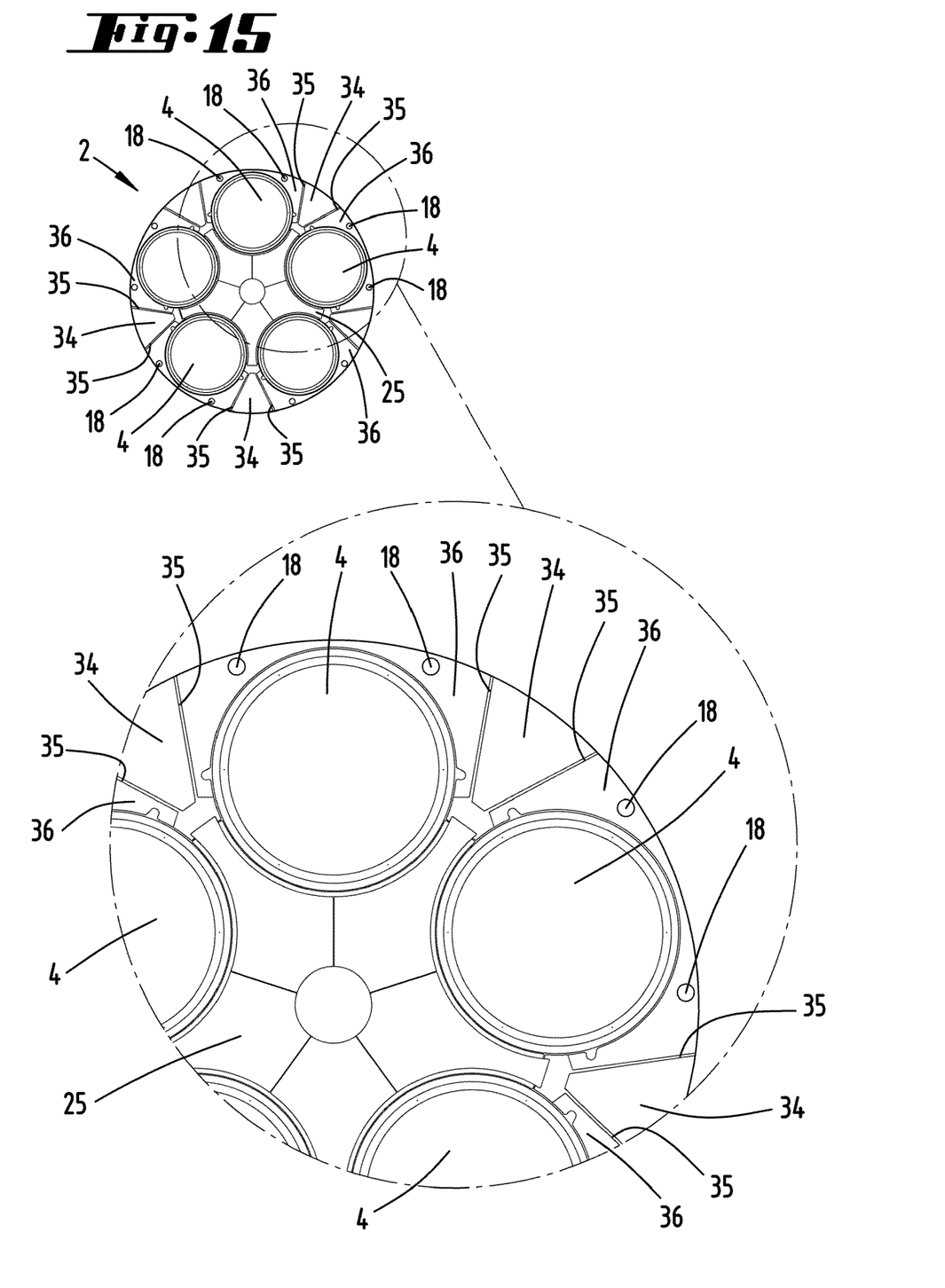
FIG. 15 is an exemplary embodiment in which a lowermost covering plate 36 partially envelops a substrate holder 4.

FIG. 15 shows an exemplary embodiment for a susceptor 2 in which a substrate holder 4 or the storage pocket that accommodates the substrate holder 4 adjoins three covering plates 36, 25. A radially outer covering plate 36 has an arc-shaped opening that partially envelops the substrate holder 4. In this exemplary embodiment, the substrate holder 4 is partially enveloped by precisely one radially outer covering plate 36.

The covering plate 36 is a lower covering plate, on which upper covering plates or precisely one upper covering plate can lie. Provided between two adjacent covering plates 36 is an additional, roughly triangular covering plate 34, which adjoins the two covering plates 36 with the formation of a gap 35. In this exemplary embodiment, the covering plate 34 does not adjoin a substrate holder 4.

The above statements serve to explain the inventions covered by the application as a whole, which each also independently advance the prior art at least by the following feature combinations, wherein two, several or all of these feature combinations can also be combined, specifically:

A susceptor arrangement, characterized in that the at least one covering element 5, 15 comprises a lowermost covering plate 6, 16, 36, which adjoins the first broad side surface 3 of the susceptor 2, and an uppermost covering plate 7, 17, which at least regionally overlaps the lowermost covering plate 6, 16, 36 and forms a free broad side surface 14 of the susceptor arrangement.

A susceptor arrangement, characterized in that the two covering plates 6, 16, 36, 7, 17 consist of SiC, quartz, $Al_2O_3$, $ZrO_2$ or SiC-coated graphite or some other suitable ceramic, crystalline or amorphous material.

A susceptor arrangement, characterized in that the lowermost covering plate 6 has a larger surface extension than the uppermost covering plate 7, and the latter lies flatly on the former.

A susceptor arrangement, characterized by storage pockets 22 arranged on the first susceptor broad side 3 for storing the substrate holder 4, wherein at least one of the lowermost covering plates 6 partially envelops two different storage pockets 22 or one or precisely one storage pocket 22.

A susceptor arrangement, characterized in that a lowermost covering plate 16 that partially envelops at least two storage pockets 22 and an uppermost covering plate 17 carried by the latter have the same layout.

A susceptor arrangement, characterized by one or several positioning elements 8, 18 for tying an uppermost covering plate 7, 17 to a lowermost covering plate 6, 16, 36 and/or for tying at least one lowermost covering plate 6, 16 and an uppermost covering plate 7, 17 lying thereupon to the susceptor 2.

A susceptor arrangement, characterized in that the positioning element 18 forms a shaft 18' that can be inserted into an insertion opening 24 of the first susceptor broad side 3, with it being provided in particular that the shaft 18' reach through an opening of a spacer element 20, with which the lowermost covering plate 6, 16, 36 is positioned at a gap distance to the first susceptor broad side 3 and/or that the positioning element 18 has a head 18", which has an enlarged diameter in relation to the shaft 18' and lies on the uppermost covering plate 17 or on the lowermost covering plate 16.

A susceptor arrangement, characterized in that the lowermost covering plate 6, 16, 36 has two openings 12, 13 spaced apart from each other, into which respectively form fitting lower sections 8' of a positioning element 8 engage, whose end face lies on the first susceptor broad side 3, and that the uppermost covering plate 7 has openings corresponding thereto, of which a first opening 10 is form fitting to an upper section 8" of the positioning element, and a second opening 9 is designed as an oblong hole, with it being provided in particular that the two openings 9, 10 of the uppermost covering plate 7 be formed by blind holes.

A susceptor arrangement, characterized in that the uppermost covering plate 7, 17 directly adjoins the lowermost covering plate 6, 16, 36.

A CVD reactor, characterized in that the at least one covering element 5, 15 has a lowermost covering plate 6, 16, 36 that directly adjoins the first broad side 3 of the susceptor 2, and an uppermost covering plate 7, 17 that covers the lowermost covering plate 6, 16, 36 and forms a free broad side surface of the susceptor arrangement, in particular according to one of the preceding claims 1 to 9.

All disclosed features (whether taken separately or in combination with each other) are essential to the invention. The disclosure of the application hereby also incorporates the disclosure content of the accompanying/attached priority documents (copy of the prior application) in its entirety, also for the purpose of including features of these documents in claims of the present application. Even without the features of a referenced claim, the subclaims characterize standalone inventive further developments of prior art with their features, in particular so as to submit partial applications based upon these claims. The invention indicated in each claim can additionally have one or several of the features indicated in the above description, in particular those provided with reference numbers and/or indicated on the reference list. The invention also relates to design forms in which individual features specified in the above description are not realized, in particular if they are recognizably superfluous with regard to the respective intended use, or can be replaced by other technically equivalent means.

| | |
|---|---|
| 1 | CVD reactor |
| 2 | Susceptor |
| 3 | First broad side |
| 4 | Substrate holder |
| 5 | Covering element |
| 6 | Lowermost covering plate |
| 7 | Uppermost covering plate |
| 8 | Positioning element |
| 8' | Lower section |
| 8" | Upper section |
| 9 | Oblong hole, blind hole |
| 10 | Form-fit blind hole |
| 11 | Gap |
| 12 | Opening |
| 13 | Opening |
| 14 | Free broad side surface |
| 15 | Covering element |
| 16 | Lowermost covering plate |
| 17 | Uppermost covering plate |
| 18 | Positioning element |
| 19 | Opening |
| 20 | Spacer element |
| 21 | Socket |
| 22 | Bag |
| 23 | Opening |
| 24 | Insertion opening |
| 25 | Covering plate |
| 26 | Covering plate |
| 27 | Gas inlet organ |
| 28 | Process chamber |
| 29 | Heating device |
| 30 | Edge |
| 31 | Channel |
| 32 | Carrier |
| 33 | Gap |
| 34 | Covering plate |
| 35 | Gap |
| 36 | Lower covering plate |

What is claimed is:

1. A susceptor arrangement, comprising:
   a substrate holder (4);
   at least one covering element (5, 15) comprising a lowermost covering plate (6, 16, 36) and an uppermost covering plate (7, 17);
   a circular or annular susceptor (2) with a first broad side surface (3), on which the substrate holder (4) and the at least one covering element (5, 15) are arranged, wherein the lowermost covering plate (6, 16, 36) adjoins the first broad side surface (3) of the susceptor (2), and wherein the covering element (5, 15) forms a plate stack in which the uppermost covering plate (7, 17) lies completely on the lowermost covering plate (6, 16, 36) and forms a free broad side surface (14) of the susceptor arrangement; and
   at least one positioning element (8, 18) inserted through both a respective opening (12, 13) of the lowermost covering plate (6, 16, 36) and through or into a respective opening (9, 10, 19) of the uppermost covering plate (7, 17), with which the uppermost covering plate (7, 17) is secured to the lowermost covering plate (6, 16, 36).

2. The susceptor arrangement of claim 1, wherein the uppermost and lowermost covering plates (6, 7, 16, 17, 36) consist of SiC, quartz, $Al_2O_3$, $ZrO_2$ or SiC-coated graphite.

3. The susceptor arrangement of claim 1, wherein each of the at least one positioning element (18) includes a shaft (18') that is configured to be inserted into a respective insertion opening (24) of the first broad side surface (3) of the susceptor (2).

4. The susceptor arrangement of claim 3, wherein the shaft (18') extends through an opening of a spacer element (20), with which the lowermost covering plate (6, 16, 36) is positioned at a gap distance to the first broad side surface (3) of the susceptor (2).

5. The susceptor arrangement of claim 3, wherein each of the at least one positioning element (18) has a head (18"), which has an enlarged diameter in relation to the shaft (18') and rests on the uppermost covering plate (17).

6. The susceptor arrangement of claim 1, wherein the one or more openings (9, 10) of the uppermost covering plate (7) are formed by blind holes.

7. The susceptor arrangement of claim 1, wherein the uppermost covering plate (7, 17) directly adjoins the lowermost covering plate (6, 16, 36).

8. A chemical vapor deposition (CVD) reactor (1), comprising:
- a process chamber (28);
- a gas inlet organ (27) for introducing a process gas into the process chamber (28);
- the susceptor arrangement of claim 1; and
- a heating device (29) configured to heat a second broad side surface (3) of the susceptor (2) lying opposite the first broad side surface (3).

9. A chemical vapor deposition (CVD) reactor (1), comprising:
- a process chamber (28);
- a gas inlet organ (27) for introducing a process gas into the process chamber (28);
- the susceptor arrangement of claim 2; and
- a heating device (29) configured to heat a second broad side surface (3) of the susceptor (2) lying opposite the first broad side surface (3).

10. The susceptor arrangement of claim 1, wherein the uppermost covering plate (7, 17) is identical in shape to the lowermost covering plate (6, 16, 36).

* * * * *